(12) United States Patent
Chen (10) Patent No.: US 10,304,855 B2
(45) Date of Patent: May 28, 2019

(54) DISPLAY PANEL, TOUCH DISPLAY DEVICE AND WIRE STRUCTURE

(71) Applicant: Innolux Corporation, Miao-Li County (TW)

(72) Inventor: Huei-Ying Chen, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 87 days.

(21) Appl. No.: 15/242,833

(22) Filed: Aug. 22, 2016

(65) Prior Publication Data

US 2017/0060325 A1    Mar. 2, 2017

(30) Foreign Application Priority Data

Aug. 24, 2015 (CN) .......................... 2015 1 0521980

(51) Int. Cl.
*H01L 27/12* (2006.01)
*G06F 3/044* (2006.01)

(52) U.S. Cl.
CPC .......... *H01L 27/1218* (2013.01); *G06F 3/044* (2013.01); *H01L 27/124* (2013.01); *H01L 27/1248* (2013.01); *G06F 2203/04103* (2013.01); *G06F 2203/04111* (2013.01); *G06F 2203/04112* (2013.01)

(58) Field of Classification Search
CPC ... G06F 3/0416; G06F 3/044; H01L 27/1248; H01L 27/1218; H01L 27/124
See application file for complete search history.

(56) References Cited

U.S. PATENT DOCUMENTS

| 2004/0169781 | A1* | 9/2004 | Lee | G02F 1/136259 349/54 |
| 2010/0253902 | A1* | 10/2010 | Yamazaki | G02F 1/1303 349/158 |
| 2011/0297930 | A1* | 12/2011 | Choi | G02F 1/133345 257/43 |
| 2015/0263176 | A1* | 9/2015 | Cheng | H01L 29/7869 257/43 |
| 2016/0306470 | A1* | 10/2016 | Park | G06F 3/044 |
| 2016/0342278 | A1* | 11/2016 | Yu | G06F 3/044 |

* cited by examiner

*Primary Examiner* — Towfiq Elahi
(74) *Attorney, Agent, or Firm* — McClure, Qualey & Rodack, LLP (57) ABSTRACT

A display panel, a touch display device and a wire structure are provided. The display panel includes a substrate and at least one wire structure. The wire structure is disposed on the substrate. The wire structure includes a metal layer and a passivated layer. A material of the metal layer includes an alloy of Nickel, Copper and Titanium. The passivated layer at least covers a part of a surface of the metal layer. A material of the passivated layer includes Nickel oxide and Titanium oxide.

16 Claims, 10 Drawing Sheets

DISPLAY PANEL, TOUCH DISPLAY DEVICE AND WIRE STRUCTURE

This application claims the benefit of People's Republic of China application Serial No. 201510521980.4, filed Aug. 24, 2015, the disclosure of which is incorporated by reference herein its entirety.

TECHNICAL FIELD

The disclosure relates in general to a display panel, a touch display device and a wire structure, and more particularly to a display panel including a wire structure with a passivated layer, a touch display device including a wire structure with a passivated layer, and a wire structure including a passivated layer.

BACKGROUND

Along with the development of technology, various electronic devices are invented. The invention of the touch panel and the display panel is a major milestone on the electric technology. The display panel has advantages of light, thin and long life, such that the conventional CRT monitor is replaced by the display panel. The touch panel can provide an intuitive interface for the user, such that the touch panel is widely used in the input devices.

In the manufacturing process of the display panel or the manufacturing process of the touch panel, several wire structures are formed by an exposing process, a developing process, and an etching process. However, because the material of the wire structures includes some high conductivity materials, such as Copper and Aluminum, the wire structures are easily corroded and the reliability is reduced. However, most anti-corrosion material cannot be etched in the etching process. Therefore, it is needed to develop a wire structure which can be etched and has high conductivity and anti-corrosion.

SUMMARY

The disclosure is directed to a display panel, a touch display device and a wire structure, wherein a passivated layer is formed in the wire structure, such that the wire structure can be etched and has high conductivity and anti-corrosion.

According to one embodiment, a display panel is provided. The display panel includes a substrate and at least one wire structure. The wire structure is disposed on the substrate. The wire structure includes a metal layer and a passivated layer. A material of the metal layer includes an alloy of Nickel, Copper and Titanium. The passivated layer at least covers a part of a surface of the metal layer. A material of the passivated layer includes Nickel oxide and Titanium oxide.

According to another embodiment, a touch display device is provided. The touch display device includes a display panel and a touch panel. The touch panel includes a substrate and a wire structure. The wire structure is disposed on the substrate. The wire structure includes a metal layer and a passivated layer. A material of the metal layer includes an alloy of Nickel, Copper and Titanium. The passivated layer at least covers a part of a surface of the metal layer. A material of the passivated layer includes Nickel oxide and Titanium oxide.

According to another embodiment, a wire structure is provided. The wire structure includes a metal layer and a passivated layer. The material of the metal layer includes an alloy of Nickel, Copper and Titanium. The passivated layer at least covers a part of a surface of the metal layer. A material of the passivated layer includes Nickel oxide and Titanium oxide.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Figure 1:
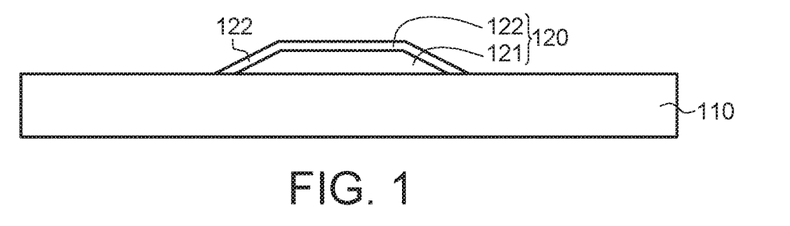
FIG. 1 shows a wire structure.

Please refer to FIG. 1, which shows a wire structure 120 including a metal layer 121 and a passivated layer 122. The wire structure 120 is disposed on a substrate 110. In one embodiment, the substrate 110 can be a glass substrate, a flexible substrate, or a patterned array substrate. The material of the metal layer 121 includes an alloy of Nickel (Ni), Copper (Cu) and Titanium (Ti). In one embodiment, the metal layer 121 may be made of 62% Nickel, 35% Copper and 3% Titanium. During the manufacturing process, the metal layer 121 is exposed in the oxygen or the air. Then, the passivated layer 122 is formed and covers at least a part of the surface of the metal layer 121. The material of the passivated layer 122 includes Nickel oxide (NiOx) and Titanium oxide (TiOx). x is a nature number.

Because Copper (Cu) is added in the metal layer 121 of the wire structure 120, the resistance of the wire structure 120 can be lower and high conductivity can be achieved. According to one experiment, if the thickness of the metal layer 121 is 200 nm, the resistance of the metal layer is lowered to a range from 1.7 to 4.3 ohm/sq.

Further, during the wet etching process, this metal layer 121 can be etched via the Aluminium acid solution which is a mix of 1.5 to 8% nitric acid, 8 to 20% acetic acid, 60 to 80% phosphoric acid.

The passivated layer 122 can prevent the metal layer 121 from being corroded in the air. According to one experiment, after the wire structure 120 is disposed in a high temperature and high humidity (65° C. and 90% RH) environment for 240 hours, the passivated layer 122 can effectively prevent the metal layer 121 from being corroded.

Figure 2A:
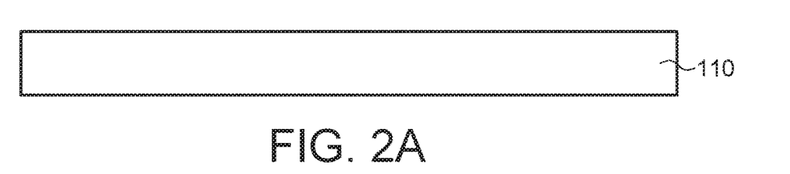
FIGS. 2A to 2F illustrate a manufacturing method of the wire structure.
Figure 2B:
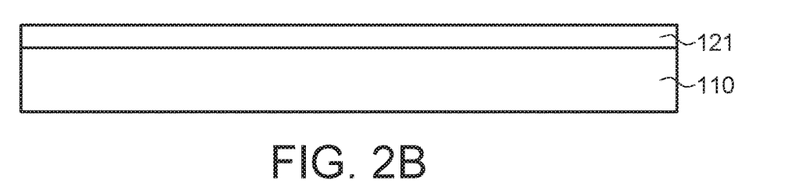
Figure 2C:
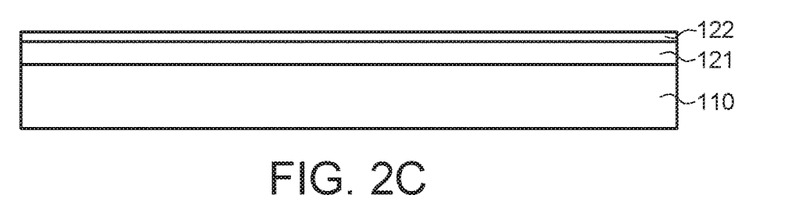
Figure 2D:
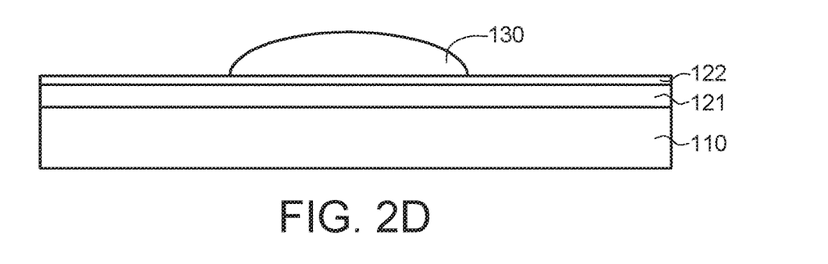
Figure 2E:
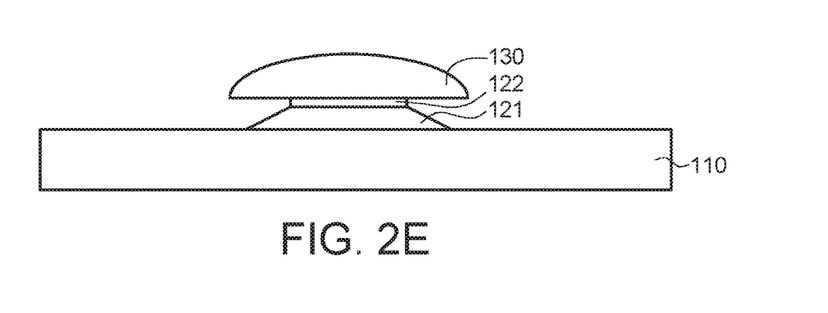
Figure 2F:
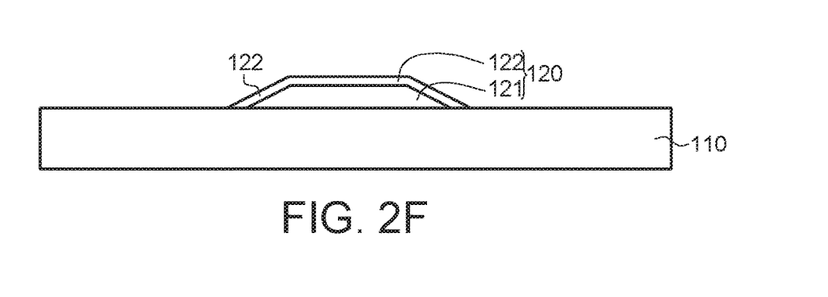

Please refer to FIGS. 2A to 2F, which illustrate a manufacturing method of the wire structure 120. As shown in FIG. 2A, the substrate 110 is provided. Then, as shown in FIG. 2B, the metal layer 121 is formed on the substrate 110. Afterwards, as shown in FIG. 2O, the oxygen or the air is injected to let the metal layer 121 being exposed in the oxygen or the air. Then, the passivated layer 122 is formed on the metal layer 121. Next, as shown in FIG. 2D, a photoresist layer 130 is formed on the passivated layer 122 and the metal layer 121. Afterwards, as shown in FIG. 2E, the passivated layer 122 and the metal layer 121 are etched by taking the photoresist layer 130 as a mask during a wet etching process. Then, as shown in FIG. 2F, the photoresist layer 130 is removed and the passivated layer 122 is formed on an etched section surface of the metal layer 121. As such, the top surface and the lateral surface of the metal layer 121 can be covered by the passivated layer 122 to prevent the metal layer 121 from being corroded.

Figure 3:
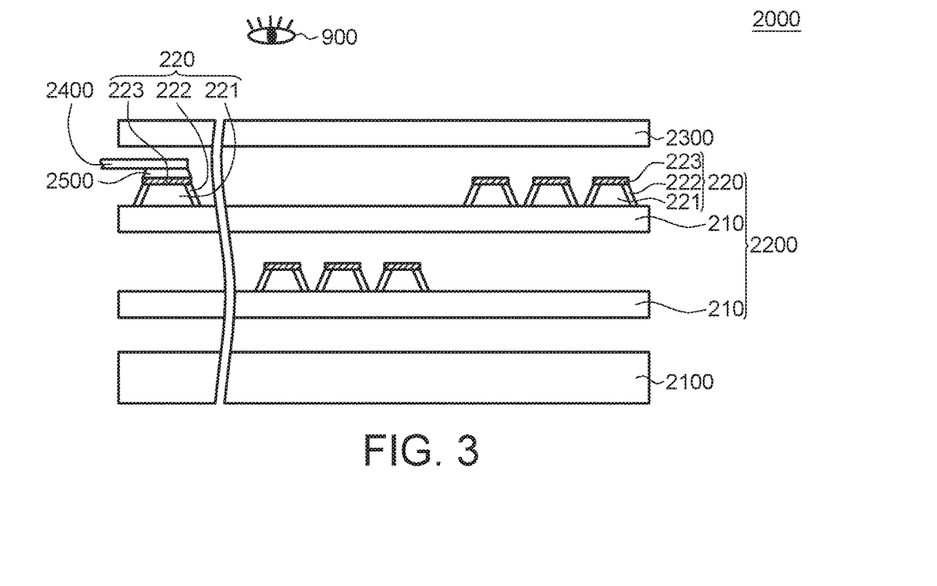
FIG. 3 shows a touch display device.
Figure 4:
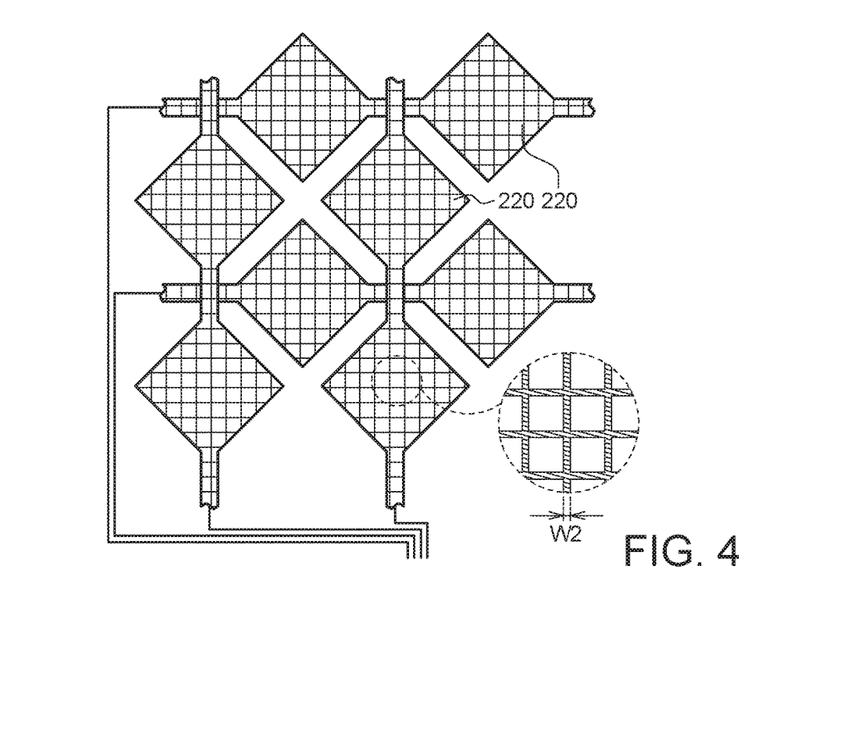
FIG. 4 shows a top view of a plurality of wire structures in FIG. 3.

The wire structure 120 described above can be etched and has high conductivity and anti-corrosion, such that the wire structure 120 can be widely used in the display panel, the touch panel, and the touch display device. Please refer to FIGS. 3 to 4. FIG. 3 shows a touch display device 2000. FIG. 4 shows a top view of a plurality of wire structures 220 in FIG. 3. The touch display device 2000 includes a display panel 2100, a touch panel 2200 and a cover glass 2300. In one embodiment, the display panel 2100 may be a LCD panel, an OLED panel or an electronic paper. The touch panel 2200 includes a plurality of wire structures 220 which are arranged in two layers and disposed on two substrates 210. Some of the wire structures 220 which are arranged in one layer are used as driving electrodes (Tx) of the touch panel 2200, and some of the wire structures 220 which are arranged in another layer are used as sensing electrodes (Rx) of the touch panel 2200. In this embodiment, each of the wire structures 220 includes a metal layer 221, a passivated layer 222 and a blackening layer 223. The blackening layer 223 is disposed on the top surface of the metal layer 221, and the passivated layer 222 is disposed on the lateral surface of the metal layer 221. The material of the blackening layer 223 is metal oxide, metal nitride or metal oxynitride. The blackening layer 223 can reduce the reflective light in front of the eye 900 for providing a comfortable vision.

The wire structures 220 which are used as the driving electrodes and the wire structures 220 which are used as the sensing electrodes are arranged on the two substrates 210 to be intersected with each other. As shown in FIG. 4, each of the wire structures 220 is mesh shaped. The width W2 of each of the wire structures 220 is 0.08 to 10 µm, and the aperture ratio of each of the wire structures 220 is 85 to 99%. As such, the wire structures 220 have high electrical conductivity and high transmittance and can be used as the driving electrodes and the sensing electrodes well.

Please refer to FIG. 3. The touch display device 2000 may further include a flexible circuit board 2400 and an anisotropic conductive film 2500 located at a peripheral circuit region. The anisotropic conductive film 2500 is disposed between the flexible circuit board 2400 and the blackening layer 223 which is conductive, such that the wire structure 220 located at the peripheral circuit region and the flexible circuit board 2400 can be electrically connected. Because the blackening layer 223 is conductive, even if the metal layer 221 is covered by the blackening layer 223, the metal layer 221 still can be electrically connected to the flexible circuit board 2400.

Figure 5A:
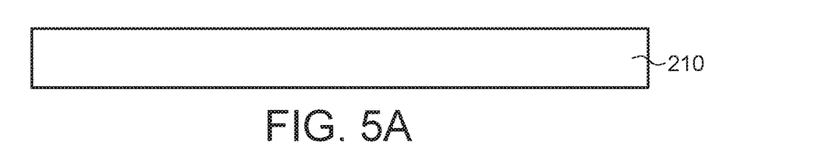
FIGS. 5A to 5E illustrate a manufacturing method of each of the wire structures including a blackening layer.
Figure 5B:
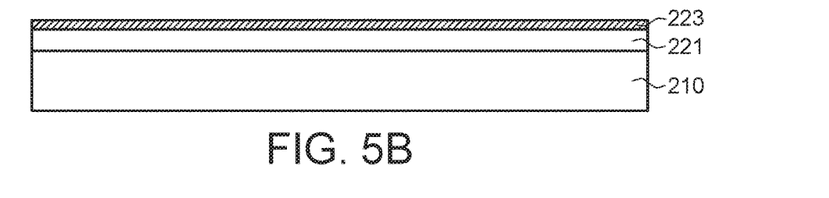
Figure 5C:
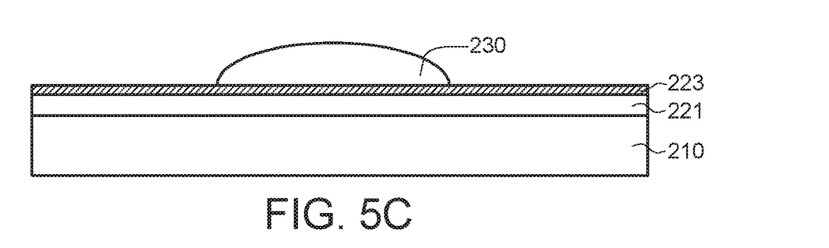
Figure 5D:
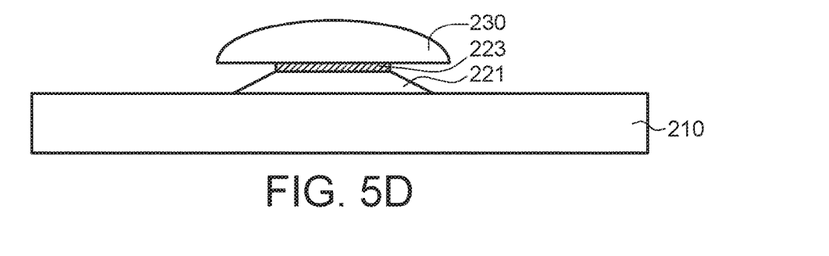
Figure 5E:
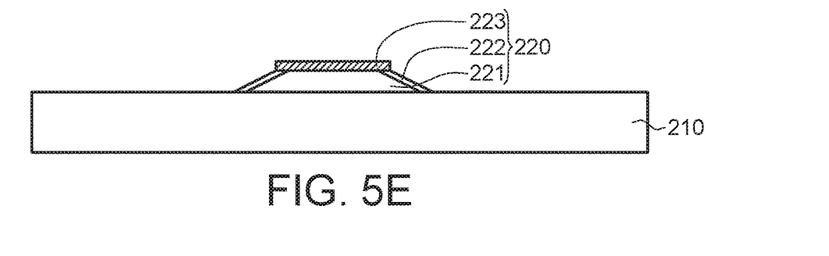

Please refer to FIGS. 5A to 5E, which illustrate a manufacturing method of each of the wire structures 220 including the blackening layer 223. As shown in FIG. 5A, the substrate 210 is provided. Then, as shown in FIG. 5B, the metal layer 221 and the blackening layer 223 are formed on the substrate 210. Afterwards, as shown in FIG. 5O, a photoresist layer 230 is formed on the blackening layer 223. Next, as shown in FIG. 5D, the blackening layer 223 and the metal layer 221 are etched during the wet etching process by taking the photoresist layer 230 as a mask. Then, as shown in FIG. 5E, the photoresist layer 230 is removed and the oxygen or the air is injected to let the metal layer 121 being exposed in the oxygen or the air, such that the passivated layer 122 is formed on an etched section surface of the metal layer 121. As such, the top surface and the lateral surface of the metal layer 221 are respectively covered by the blackening layer 223 and the passivated layer 222 to prevent the metal layer 221 from being corroded.

Figure 6:
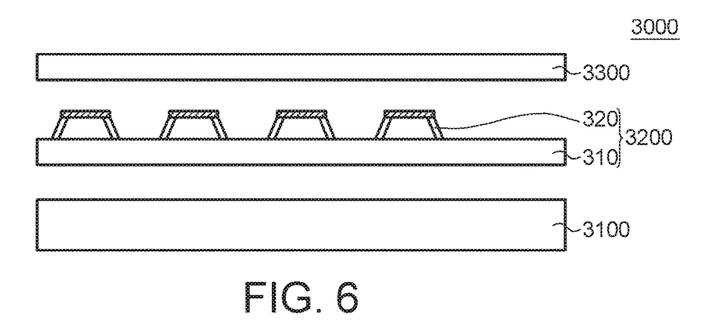
FIG. 6 shows another touch display device.
Figure 7:
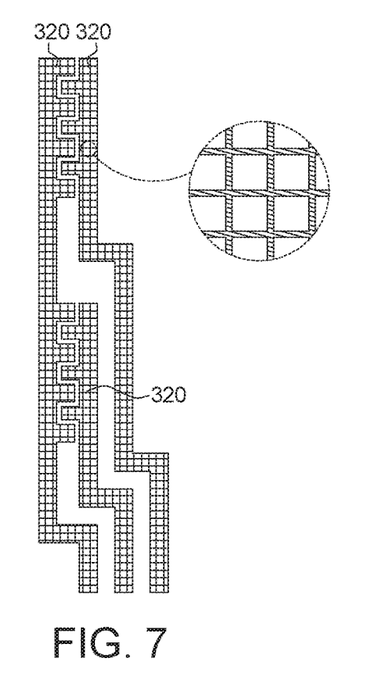
FIG. 7 shows a top view of a plurality of wire structures in FIG. 6.

Please refer to FIGS. 6 to 7. FIG. 6 shows another touch display device 3000. FIG. 7 shows a top view of a plurality of wire structures 320 in FIG. 6. The touch display device 3000 includes a display panel 3100, a touch panel 3200 and a cover glass 3300. The touch panel 3200 includes the wire structures 320 which are arranged in one layer and a substrate 310. The wire structures 320 are disposed on the substrate 310. Some of the wire structures 320 are used as the driving electrodes of the touch panel 3200, and some of the wire structures 320 are used as the sensing electrodes of the touch panel 3200. The wire structures 320 are similar to the wire structures 220 in FIG. 3, and the similarities are not repeated here.

In another embodiment, the display panel 3100 and the touch panel 3200 can be manufactured by the Touch On Display technology or the In-cell Touch technology. The wire structures 320 can be disposed on the back side of an upper substrate of the display panel 3100 without the substrate 310.

Figure 8:
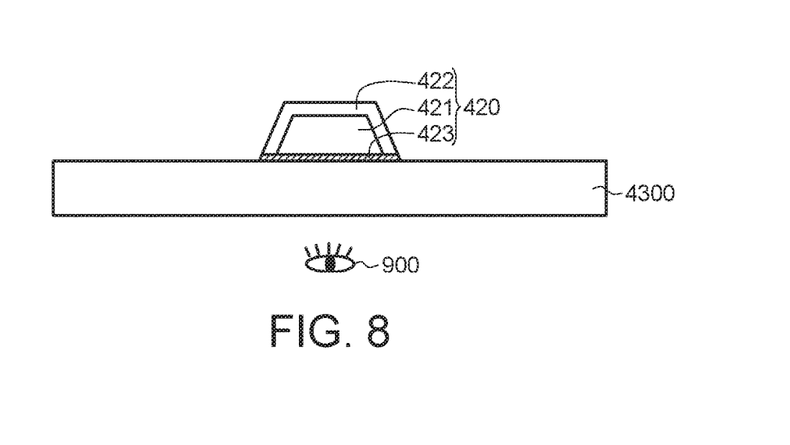
FIG. 8 shows another wire structure.

Please refer to FIG. 8, which shows another structure 420. In the embodiment described in FIG. 3, the eye 900 views the touch display device 2000 from the top side, so the blackening layer 223 is disposed on the top surface of the metal layer 222 to reduce the reflective light in front of the eye 900. In the embodiment of FIG. 8, the wire structure 420 is directly disposed on the cover glass 4300. A blackening layer 423 is disposed at the bottom of a metal layer 421. That is to say, the blackening layer 423 is disposed between the metal layer 421 and the cover glass 4300. A passivated layer 422 is formed on the top surface and the lateral surface of the metal layer 421. The blackening layer 423 can reduce the reflective light reflected from the metal layer 421 and the passivated layer 422 can prevent the metal layer 421 from being corroded.

Figure 9:
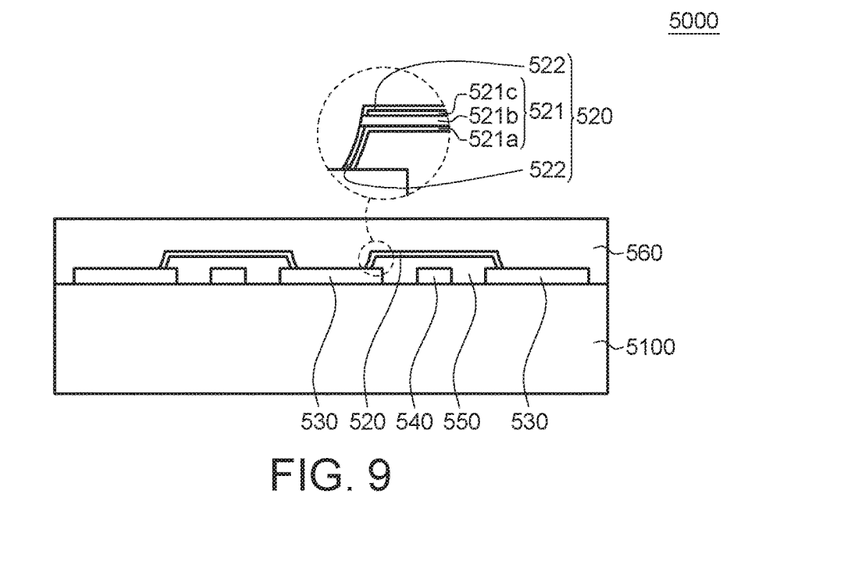
FIG. 9 shows another touch display device.
Figure 10:
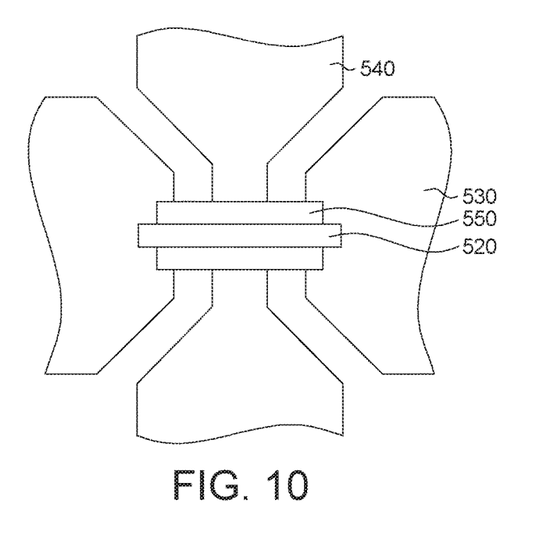
FIG. 10 shows a top view of a wire structure, two first electrodes, two second electrodes and a spacing insulation layer.

Please refer to FIGS. 9 and 10. FIG. 9 shows another touch display device 5000. FIG. 10 shows a top view of one wire structure 520, two first electrodes 530, one second electrode 540 and one spacing insulation layer 550. The embedding technology, such as Touch On Display technology or In-cell Touch technology and the bridging technology are applied in the touch display device 5000. The first electrodes 530 and the second electrode 540 are directly formed on the display panel 5100. Each of the first electrodes 530 can be used as the driving electrode and the second electrode 540 can be used as the sensing electrode. Or, each of the first electrodes 530 can be used as the sensing electrode and the second electrode 540 can be used as the driving electrode. As shown in FIG. 10, the spacing insulation layer 550 covers a part of the second electrode 540, and the wire structure 520 is disposed on the spacing insulation layer 550 and connects the adjacent first electrodes 530. As shown in FIG. 9, the wire structures 520, the first electrodes 530, the second electrode 540, and the spacing insulation layer 550 are disposed on one substrate, such as the upper substrate of the display panel 5100, to form one touch panel.

As shown in FIG. 9, the wire structure 520 includes a metal layer 521 and a passivated layer 522. The metal layer 521 includes a bottom layer 521a, a middle layer 521b and a top layer 521c. The middle layer 521b is disposed on the bottom layer 521a, and the top layer 521c is disposed on the middle layer 521b. The material of each of the bottom layer 521a and the top layer 521c includes an alloy of Nickel, Copper and Titanium. The material of the middle layer 521b includes Aluminum. The thickness of each of the bottom layer 521a and the top layer 521c is 180 Å, and the thickness of the middle layer 521b is 2000 Å. The middle layer 521b having high conductivity is formed in the metal layer 521 of the wire structure 520, such that the conductivity of the wire structure 520 can be improved.

The passivated layer 522 covers a top surface of the top layer 521c, a lateral surface of the top layer 521c and a lateral surface of the bottom layer 521a. A protective isolation layer 560 covers the wire structures 520, the first electrodes 530 and the second electrodes 540.

In this embodiment, the passivated layer 522 is formed at most of the surface of the wire structure 520, so the wire structure 520 can be prevented from being corroded. The anti-corrosion of the wire structure 520 is better than that of a wire structure composed of a molybdenum nitrogen alloy layer, an aluminum layer, and a molybdenum nitrogen alloy layer.

Figure 11:
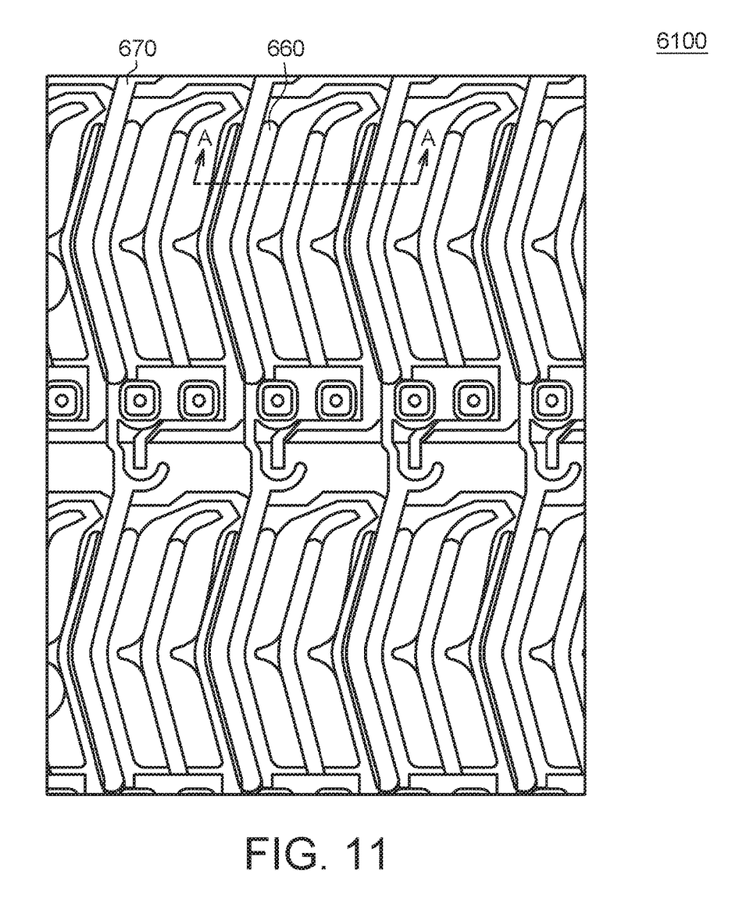
FIG. 11 shows a top view of a part of a display panel.
Figure 12:
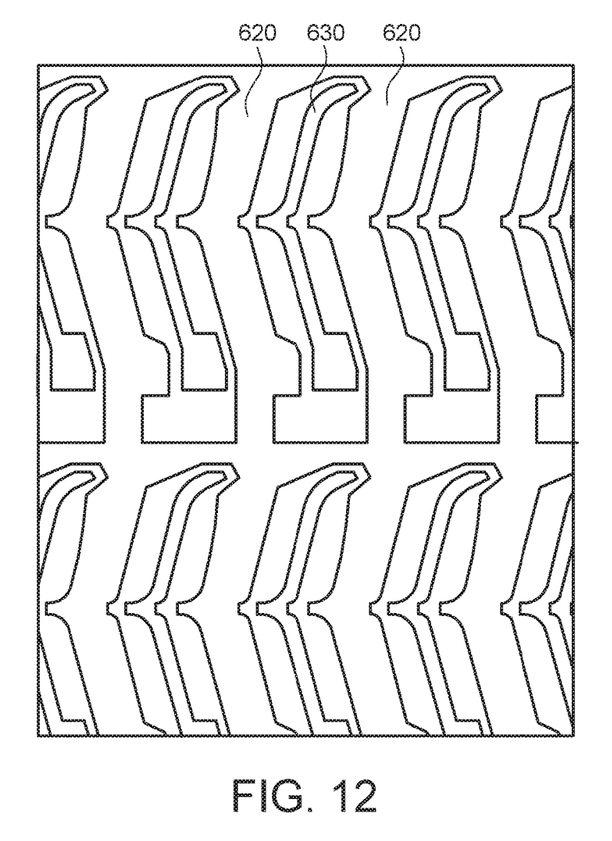
FIG. 12 shows a top view of a plurality of wire structures and a plurality of wire structures in FIG. 11.
Figure 13:
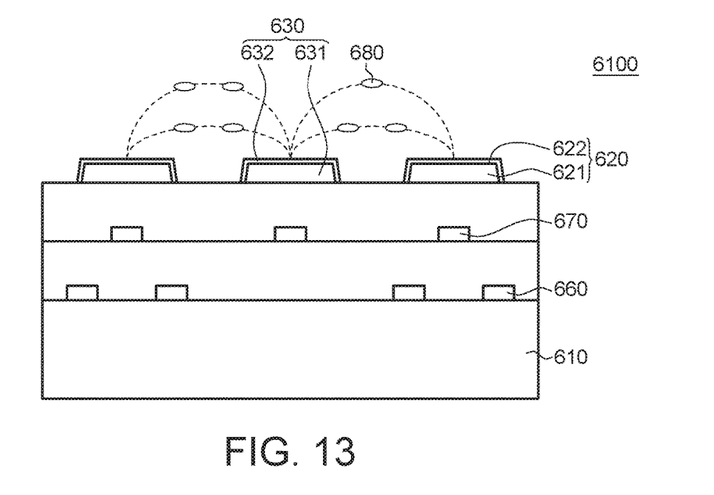
FIG. 13 shows a cross-sectional view of the display panel in FIG. 11 along with a cross section line A-A.

Please refer to FIGS. 11 to 13. FIG. 11 shows a top view of a part of a display panel 6100. FIG. 12 shows a top view of a plurality of wire structures 620 and a plurality of wire structures 630 in FIG. 11. FIG. 13 shows a cross-sectional view of the display panel 6100 in FIG. 11 along with a cross section line A-A. As shown in FIG. 13, the display panel 6100 includes a substrate 610, the wire structures 620, the wire structures 630, a plurality of metal shielding lines 660 and a plurality of data lines 670. The metal shielding lines 660 and the data lines 670 are located at different layers. One of the wire structures 620 overlaps with one of the data lines 670 and two of the metal shielding lines 660. One of the wire structures 630 overlaps with one of the data lines 670.

Each of the wire structures 620 is a common electrode, and each of the wire structures 630 is a pixel electrode. The wire structures 620 and the wire structures 630 are formed at the same manufacturing stage. Each of the wire structures 620 includes a metal layer 621 and a passivated layer 622. Each of the wire structures 630 includes a metal layer 631 and a passivated layer 632. The wire structures 620, 630 are similar to the wire structures 220 in FIG. 3, and the similarities are not repeated here. A horizontal electric field is formed between one of the wire structures 620 and one of the wire structures 630 which are adjacent, such that liquid crystals 680 are arranged in the horizontal direction.

In this embodiment, the wire structures 620, 630 are used to replace the transparent conductive film whose thickness is 500 Å. The thickness of each of the wire structures 620, 630 can be reduced to be lower than 200 Å. The lateral surface of each of the wire structures 620, 630 became small. The non-horizontal electric field formed by the lateral surface can be reduced, and the liquid crystals 680 will not affected by the non-horizontal electric field.

Instead of the transparent conductive film, the wire structures 620, 630 are used to prevent from the light leakage or the flash being generated at the metal shielding lines 660 and the data lines 670.

Furthermore, each of the wire structures 620, 630 includes the passivated layer 622, 632. The anti-corrosion of each of the wire structures 620, 630 is better than that of a Molybdenum and Titanium alloy layer.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A display panel, comprising:
   a substrate; and
   at least one wire structure, disposed on the substrate, wherein the wire structure includes:
   a metal layer, whose material includes an alloy of Nickel, Copper and Titanium; and
   a passivated layer, which at least covers a part of a surface of the metal layer, wherein a material of the passivated layer includes Nickel oxide and Titanium oxide;
   wherein the metal layer includes:
     a bottom layer, whose material includes an alloy of Nickel, Copper and Titanium;
     a middle layer, disposed on the bottom layer, wherein a material of the middle layer includes Aluminum; and
     a top layer, disposed on the middle layer, wherein a material of the top layer includes an alloy of Nickel, Copper and Titanium.

2. The display panel according to claim 1, wherein the wire structure is a pixel electrode or a common electrode.

3. The display panel according to claim 1, wherein a number of the at least one wire structure is two, one of the wire structures is a pixel electrode, another one of the wire structures is a common electrode, and the wire structures are formed at the same manufacturing stage.

4. The display panel according to claim 1, further comprising:
   a metal shielding line; and
   a data line, disposed above the metal shielding line;
   wherein the wire structure is disposed above the metal shielding line and the data line, and overlaps with the metal shielding line and the data line.

5. The display panel according to claim 1, wherein a thickness of the wire structure is lower than 200 Å.

6. A touch display device, comprising:
   a display panel; and
   a touch panel, including:
   a substrate; and
   a wire structure, disposed on the substrate, wherein the wire structure includes:
   a metal layer, whose material includes an alloy of Nickel, Copper and Titanium; and
   a passivated layer, which at least covers a part of a surface of the metal layer, wherein a material of the passivated layer includes Nickel oxide and Titanium oxide;
   wherein the metal layer includes:
     a bottom layer, whose material includes an alloy of Nickel, Copper and Titanium;

a middle layer, disposed on the bottom layer, wherein a material of the middle layer includes Aluminum; and a top layer, disposed on the middle layer, wherein a material of the top layer includes an alloy of Nickel, Copper and Titanium.

7. The touch display device according to claim 6, wherein the wire structure is mesh shaped.

8. The touch display device according to claim 7, wherein a width of the wire structure is 0.08 to 10 μm.

9. The touch display device according to claim 7, wherein an aperture ratio of the wire structure is 85 to 99%.

10. The touch display device according to claim 6, wherein the wire structure further includes a blackening layer, the metal layer is disposed between the blackening layer and the substrate, and the touch display device further includes:

a flexible circuit board; and an anisotropic conductive film (ACF), disposed between the flexible circuit board and the blackening layer for connecting the wire structure and the flexible circuit board.

11. The touch display device according to claim 6, further comprising:

at least two first electrodes, disposed on the substrate;

a second electrode, disposed on the substrate and disposed between the first electrodes; and an spacing insulation layer, covering a part of the second electrode, wherein the wire structure is disposed on the spacing insulation layer and connects the first electrodes.

12. The touch display device according to claim 6, wherein the passivated layer covers a top surface of the top layer, a lateral surface of the top layer and a lateral surface of the bottom layer.

13. A wire structure, comprising:

a metal layer, whose material includes an alloy of Nickel, Copper and Titanium; and a passivated layer, which at least covers a part of a surface of the metal layer, wherein a material of the passivated layer includes Nickel oxide and Titanium oxide;

wherein the metal layer includes:

a bottom layer, whose material includes an alloy of Nickel, Copper and Titanium;

a middle layer, disposed on the bottom layer, wherein a material of the middle layer includes Aluminum; and a top layer, disposed on the middle layer, wherein a material of the top layer includes an alloy of Nickel, Copper and Titanium.

14. The wire structure according to claim 13, further comprising:

a blackening layer, at least disposed on a part of the surface of the metal layer.

15. The wire structure according to claim 14, further comprising:

a blackening layer, disposed at a bottom of the metal layer.

16. The wire structure according to claim 13, wherein the passivated layer covers a top surface of the top layer, a lateral surface of the top layer and a lateral surface of the bottom layer.

* * * * *